United States Patent [19]

Thornton

[11] Patent Number: 4,830,983

[45] Date of Patent: May 16, 1989

[54] METHOD OF ENHANCED INTRODUCTION OF IMPURITY SPECIES INTO A SEMICONDUCTOR STRUCTURE FROM A DEPOSITED SOURCE AND APPLICATION THEREOF

[75] Inventor: Robert L. Thornton, East Palo Alto, Calif.

[73] Assignee: Xerox Corporation, Stamford, Conn.

[21] Appl. No.: 117,596

[22] Filed: Nov. 5, 1987

[51] Int. Cl.$^4$ .................... H01L 31/00; H01L 33/00; H01L 21/00; H01L 21/22

[52] U.S. Cl. .................................. 437/161; 437/162; 437/987

[58] Field of Search ................. 437/161, 162, 22, 152, 437/173, 987

[56] References Cited

U.S. PATENT DOCUMENTS

| | | | |
|---|---|---|---|
| 3,530,015 | 9/1970 | Antell | 437/162 |
| 4,378,255 | 3/1983 | Holonyak, Jr. et al. | 437/23 |
| 4,594,603 | 6/1986 | Holonyak, Jr. | 357/16 |
| 4,615,766 | 10/1986 | Jackson et al. | 156/662 |
| 4,632,713 | 12/1986 | Tiku | 437/942 |
| 4,634,474 | 1/1987 | Camlibel et al. | 437/132 |
| 4,639,275 | 1/1987 | Holonyak, Jr. | 437/126 |
| 4,642,879 | 2/1987 | Kawata et al. | 437/22 |
| 4,743,569 | 5/1988 | Plumton et al. | 437/247 |

OTHER PUBLICATIONS

G. R. Antell et al., "The Diffusion of Silicon in Gallium Arsenide", Solid-State Electronics, vol. 8, pp. 943–946 (1965), Pergamon Press, Gt. Brit.

E. Omura et al., "Closed-Tube Diffusion of Silicon in GaAs from Sputtered Silicon Film", Electronic Letters, vol. 22(9), pp. 496–498 (Apr. 24, 1986).

T. Onuma et al., "Study of Encapsulants for Annealing Si-Implanted GaAs", Journal of Electrochemical Society, vol. 129(4), pp. 837–840 (Apr. 1982).

M. E. Greiner et al., "Diffusion of Silicon in Gallium Arsenide Using Rapid Thermal Processing: Experiment and Model", Applied Physics Letters, vol. 44(8), pp. 750–752 (Apr. 15, 1984).

J. Kobayashi et al., "Effect of Rapid Thermal Annealing for the Compositional Disordering of Si-Implanted AlGaAs/GaAs Superlattices", Applied Physics Letters, vol. 50(9), pp. 519–521 (Mar. 2, 1987).

K. L. Kavanagh et al., "Silicon Diffusion At Polycrystalline-Si/GaAs Interfaces", Applied Physics Letters, vol. 47(11), pp. 1208–1210 (Dec. 1, 1985).

K. L. Kavanagh et al., "The Polycrystalline-Si Contact to GaAs", Journal of the Electrochemical Society, vol. 133(6), pp. 1176–1179 (Jun., 1986).

E. Omura et al., "Silicon Diffusion Into $Al_xGa_{1-x}As$ (x=0–0.4) From A Sputtered Silicon Film", Applied Physics Letters, vol. 50(5), pp. 265–266 (Feb. 2, 1987).

Tae Earn Shim et al., "Si Film As An Annealing Cap for Si-Implanted GaAs", Applied Physics Letters, vol. 48(10), pp. 641–643 (Mar. 10, 1986).

R. L. Thornton et al., "Low Threshold Planar Buried Heterostructure Lasers Fabricated by Impurity-Induced Disordering", Applied Physics Letters, vol. 47(12), pp. 1239–1241 (Dec. 15, 1985).

Meehan et al., Applied Physics Letters, vol. 45(5), "Disorder of $Al_xGa_{1-x}As$–GaAs Superlattice by Donor Diffusion" (Sep. 1, 1984), pp. 549–551.

Thornton et al., Applied Physics Letters, vol. 49(3), "Highly Efficient, Long Lived AlGaAs Lasers Fabricated by Silicon Impurity Induced Disordering" (Jul. 21, 1986), pp. 133 and 134.

Primary Examiner—Brian E. Hearn
Assistant Examiner—B. Everhart
Attorney, Agent, or Firm—W. Douglas Carothers, Jr.

[57] ABSTRACT

A two step annealing process is utilized for performing imputity induced disordering comprising an initial higher temperature, shorter term or rapid thermal anneal (RTA) treatment followed by a lower temperature, longer term or slow thermal anneal (STA) treatment. This two step impurity induced disordering (IID) anneal process enhances the amount of and depth of impurity species or diffusant penetration into the crystalline structure undergoing IID treatment. Also, it provides for improved accuracy in controlling the extend of impurity species concentration and the extent of its penetration into the cyrstalline structure so that resulting diffusion profiles in such structures can be systematically reproduced.

7 Claims, 4 Drawing Sheets

METHOD OF ENHANCED INTRODUCTION OF IMPURITY SPECIES INTO A SEMICONDUCTOR STRUCTURE FROM A DEPOSITED SOURCE AND APPLICATION THEREOF

CROSS-REFERENCE TO RELATED APPLICATIONS

This application contains subject matter related to the subject matter of patent application Ser. No. 07/117,593, filed Nov. 5, 1987 and patent application Ser. No. 07/117,777, filed Nov. 5, 1987, both assigned to the same assignee herein.

BACKGROUND OF THE INVENTION

This invention relates to a method of introducing impurity species into a semiconductor structure and more particularly to the introduction of impurity species from a thin film source deposited on a semiconductor structure employing a two step annealing treatment to bring about interdiffusion of elemental constituents making up the structure, which is known in the art as impurity induced disordering (IID).

It has been recognized that impurity diffusion into Group III-V compound semiconductors is an important step in the fabrication of optoelectronic devices. Recently, much attention has been given to the diffusion of Si into GaAs. Also, recently, considerable attention has been given to impurity induced disordering (IID) in GaAs/GaAlAs quantum well structures.

In particular, the diffusion of silicon in GaAs has been under study and investigation for many years. As an example, G. R. Antell in an article, "The Diffusion of Silicon in Gallium Arsenide", Solid-State Electronics, Vol. 8, pp. 943-946 (1965), discloses the diffusion of Si into GaAs carried out at high temperatures in a sealed quartz ampoule containing an overpressure of As to prevent the outdiffusion of As from the GaAs. The diffusivity and activation of Si in GaAs is proportional to the As overpressure and the Ga vacancy concentrations. Excess As pressure in a closed ampoule is required for successful diffusion. See, also, the more recent article on this subject of E. Omura et al, "Closed-Tube Diffusion of Silicon in GaAs From Sputtered Silicon Film", Electronic Letters, Vol. 22 (9), pp. 496-498 (Apr. 24, 1986).

More recently, the effects of encapsulation relative to Si implanted into GaAs have been studied to prevent the outdiffusion from GaAs and provide, in some cases, a source of Si for diffusion into GaAs. See the article of T. Onuma et al, "Study of Encapsulants for Annealing Si-Implanted GaAs", Journal of Electrochemical Society, Vol. 129 (4), pp. 837-840 (April, 1982). Diffusion of Si was enhanced by $SiO_2$ encapsulation but was negligible with $Si_3N_4$ encapsulation or when capless. The activation of the diffusion process is initiated at high anneal temperatures, such as 750° C. and above. Onuma et al indicates that the $SiO_2$ cap layer is permeable to Ga while the $Si_3N_4$ cap layer is impermeable to Ga and As so that $SiO_2$ permits the diffusion of Ga to provide for Ga vacancies in the GaAs and the substitution of Si. However, due to the deposition method employed, cracks developed in some of the samples when subjected to the subsequent high temperature annealing process. M. E. Greiner et al in the article, "Diffusion of Silicon in Gallium Arsenide Using Rapid Thermal Processing: Experiment And Model", Applied Physics Letters, Vol. 44 (8), pp. 750-752 (Apr. 15, 1984) examines Si diffusion from a thin elemental deposited source thereof using rapid thermal processing with several difficult encapsulants. The results show that diffusion was dependent on the type of encapsulant. The Si source layer and the encapsulants were deposited at relative low temperatures, i.e., below 450° C., with subsequent annealing being accomplished at high temperatures of 850° C.–1050° C. for times from 3 seconds to 300 seconds providing diffusion depths to 0.2 $\mu$m. High concentrations of Si diffused into GaAs resulted from a $SiO_2$ capped thin Si source layer. In particular, a model proposed by Greiner et al explains that paired Si atoms can move substitutionally by exchanging sites with either Ga or As vacancies which explains the enhanced diffusion when using a $SiO_2$ cap.

There have been recent investigations in the art of impurity diffusion studying the effect of rapid thermal annealing in comparison with standard furnace annealing for the compositional disordering of Si implanted GaAs/GaAlAs superlattices. The separate investigations of these two annealing approaches demonstrated that employing rapid thermal annealing (970° C. for 10 seconds), the implantation damage in the sample could be eliminated without disordering of the superlattice but disordering of the superlattice would occur using furnace annealing (850° C. for 30 minutes). See the article of J. Kobayashi et al, entitled "Effect of Rapid Thermal Annealing For the Compositional Disodering of Si-Implanted AlGaAs/GaAs Superlattices", Applied Physics Letters, Vol. 50 (9), pp. 519-521, Mar. 2, 1987. The conclusion reached was that the difference between disordering and not disordering in using these independent annealing processes was primarily the extent and magnitude of the Si diffusion into the superlattice.

K. L. Kavanagh et al in the articles, "Silicon Diffusion at Polycrystalline-Si/GaAs Interfaces", Applied Physics Letters, Vol. 47 (11), pp. 1208-1210 (Dec. 1, 1985) and "The Polycrystalline-Si Contact to GaAs", Journal of the Electrochemical Society, Vol. 133 (6), pp. 1176-1179 (June, 1986), reveals that, under proper conditions, the addition of As to the Si source layer revealed further enhanced diffusion, i.e., greater concentrations, of Si into the GaAs. These conditions called for depositing hydrogenated amorphous Si (a-Si:H) onto GaAs in a silane plasma at 450° C. and subsequent annealing at temperatures between 600° C.–1020° C. The results showed that high level interdiffusion of Si atomic pairs with Ga and As vacancies occurs when As is initially added to the Si source layer. However, the surface area of films deposited onto GaAs continued to have a large number of randomly spaced bubbles, indicative of compressive stresses in the film, developed after the high temperature annealing process.

In copending application Ser. No. 117,593, filed concurrently with this application, a thin film bilayer composite source is deposited on a semiconductor structure that is stable at annealing temperatures required for the activation of the diffusion process so that pin holes, cracks, bubbles or other such irregularities do not appear in the deposited film or in the underlying semiconductor structure. In using a thin film deposited source for incorporating an impurity species or diffusant, such as Si, the level of impurity incorporation and the depth of impurity penetration into the crystal bulk increases with increasing diffusion temperature. However, it is sometimes desirable to vary the surface concentration of the impurity species independently of the total diffusion depth. Also, it is important in some applications to initially have a higher concentration of impurity species at the surface of the crystal bulk prior to thermal annealing. This capability would permit sharper transitions of ordered/disordered profile and better control over the performance of IID.

Thus, it is an object of this invention to provide a method of enhanced introduction of impurity species into a semiconductor structure from a deposited impurity source without incurring bubbles or cracks or other irregularities in the film or to be underlying semiconductor structure with improved control over the incorporation of the diffusant, the rate and depth of diffusion and the reproducibility of desired diffusion profiles, leading to improved device yields.

SUMMARY OF THE INVENTION

According to this invention, a two step annealing process is utilized for performing impurity induced disordering comprising an initial higher temperature, shorter term or rapid thermal anneal (RTA) treatment followed by a lower temperature, longer term or slow thermal anneal (STA) treatment. This two step impurity induced disordering (IID) anneal process enhances the amount of and depth of impurity species or diffusant penetration into the crystalline structure undergoing IID treatment. Also, it provides for improved accuracy in controlling the extent of impurity species concentration and the extent of its penetration into the crystalline structure so that resulting diffusion profiles in such structures can be systematically reproduced.

For the purpose of realizing semiconductor device structures via impurity induced disordering (IID), it is desirable to have an as abrupt transition as possible between regions in the semiconductor structure that are disordered vis a vis regions therein that remain in their as-grown state. One key factor in obtaining such abruptness is to have as steep a gradient as possible in the falling edge of the diffusion profile for the impurity species. In the case of Si impurity in a GaAs crystal, as is true for most impurities, the diffusion coefficient exhibits nonlinear behavior when the impurity concentration is high. This is basically due to interaction effects between the individual impurity atoms, which become more significant at higher concentrations, resulting in a higher diffusion coefficient at higher Si concentrations in GaAs. With the result of enhanced diffusion at high impurity concentration levels imposed at the crystal surface to disordered, it is possible to achieve very fast Si rolloff on the tail edge of the Si diffusion when the Si concentration is sufficiently high. Such an abrupt rolloff translates into the desired abrupt transition desired between disordered and ordered as-grown material in the structure. The foregoing is primarily documented in patent application Ser. No. 07/117593. The purpose of this application is the enhancement of the surface concentration of the impurity to enhance this abrupt rolloff.

The method of this invention basically comprises the steps of depositing an impurity source containing a disordering element on a crystalline structure, thermally annealing the structure at a high temperature, followed by a thermal anneal at a lower temperature, for a longer period of time. The first step in the process is a shorter term diffusion initiation step at a high temperature, e.g., the employment of a diffusion source of Si at 1000° C. for several tens of seconds. The purpose of this step is to overcome any interfacial barrier which may exist to the diffusion of the impurity species, such as due to residual surface oxides, as well as provide a high surface concentration of the impurity species at the surface of the crystalline structure bulk. The second step in the process is a longer term diffusion step at a lower temperature, during which the diffusion process is much more accurately controlled due to the slower diffusion rate. The slower diffusion rate makes it possible to achieve the desired depth of diffusion into the crystalline structure with a higher degree of accuracy due to the heavy increase in surface concentration of the impurity species in the structure surface.

For an impurity species such as Si, this second anneal step is typically performed at 850° C. for several hours depending on the desired diffusion or the desired resultant junction depth. As a result of this two step diffusion process, reproducibility of diffusion profiles is greatly improved, leading to improved device yield. The increase in surface concentration of the impurity species has the dual advantage of creating a steeper (more abrupt) diffusion profile and reliably yielding the high surface concentration needed for the disordering process to occur in a uniform and reproducible manner. Further, the increase in surface concentration of the impurity species employing the short anneal step produces deeper penetration of the diffusion profile into the crystal bulk during the longer term, lower temperature anneal step at a given anneal temperature compared to penetrations obtained without the use of the initial high temperature anneal step prior to the longer term, lower temperature anneal step at the same given anneal temperature.

The thin film bilayer composite source may be comprised of a deposited impurity source layer, e.g., Si or Ge, heavily doped with a diffusion enabling agent, e.g., As, P or Sb in the range of of 5%–20% atomic weight, and capped with a passivating layer, e.g., $Si_3N_4$, $SiO_2$, AlN or $SiO_xN_y$. In a particular embodiment, a thin film bilayer composite source may be a polycrystalline Si layer on the surface of said structure vapor deposited at a temperature in excess of 500° C. in the presence of a source of As to heavily dope the layer in the range of 5%–20% atomic weight and a thin cap layer of $Si_3N_4$ deposited on the Si layer at a temperature in excess of 500° C. having a thickness only sufficient to prevent the outdiffusion of Ga and As, which thickness is in the range of about 400 Å–700 Å.

An important aspect of the employment of the bilayer composite source as a diffusion source for Group III–V structures is that the composite source is initially deposited at temperatures above 500° C., i.e. at temperatures that are into the range of the longer term anneal treatment, e.g. about 500° C.–900° C., preferably 700° C.–850° C., so that cracking due to thermal strain or compressive stress will not occur during this subsequent comparatively long period of thermal annealing thereby providing reproducible, uniform impurity diffusion into Group III–V structures. This deposition techniques can even yield films that are stable up to the high temperature range required for the RTA processing of this invention.

Further, hydrogenated amorphous Si deposition is not employed since it results in the boiling off of hydrogen from the a-Si:H source when subjected to the high annealing temperatures causing the deposited film to bubble. This bubbling subjects the semiconductor structure to nonuniform diffusion of the impurity species during the longer term anneal treatment. The initial deposition of the bilayer composite source at about the same temperature as the longer term anneal treatment substantially reduces, if not eliminates, the occurrence of cracks caused by thermal strain and compressive stress in the later longer term thermal anneal step or the formation of film bubbles due to the outdiffusion of hydrogen in the later longer term thermal anneal step.

In a particular embodiment of this invention, a method of introducing impurity species into a Group III-V semiconductor structure, e.g., a GaAs layer, comprises the steps of chemically depositing a Si diffusion source layer on the surface of the Group III-V structure in a temperature range of about 500° C.–900° C. in the presence of a source of As heavily doping the diffusion layer in the range of 5%–20% by atomic percent, thereafter chemically depositing a thin cap layer of $Si_3N_4$ on the Si diffusion source layer within the same above mentioned temperature range, and thereafter annealing the semiconductor structure at a high temperature, eg., 900° C.–1100° C., for a short period of time, e.g., 10–200 seconds, followed by a longer period of anneal, such as 3–10 hours, within the same above mentioned temperature range of about 500° C.–900° C. to thermally diffuse Si further into the III-V structure.

Other objects and attainments together with a fuller understanding of the invention will become apparent and appreciated by referring to the following descriptions and claims taken in conjunction with the accompanying drawings.

DETAILED DESCRIPTION OF THE PREFERRED EMBODIMENTS

Figure 1:
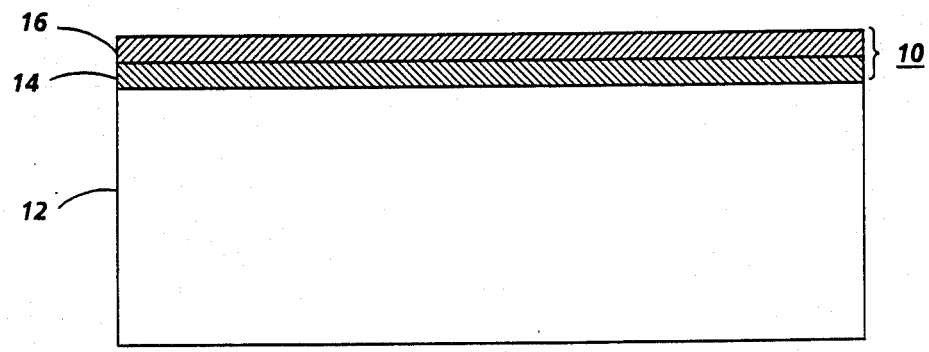
FIG. 1 is a side elevation of a thin film composite source deposited on a substrate.

Reference is now made to FIG. 1 wherein there is shown the thin film bilayer composite source 10 of this invention. Bilayer composite source 10 is deposited on a semiconductor structure 12. Structure 12 may be a Group III-V compound or alloy comprising Group III-V compositional constituents (e.g., $Ga_{1-x}Al_xAs$ where x is varied between 0 and 1) or may be comprised of one or more or a series of Group III-V layers of differing bandgap or may be a Group III-V substrate, e.g. GaAs. Source 10 consists of two deposited layers having preferred deposited characteristics and comprise an impurity source layer 14 heavily doped with a diffusion enabling agent and a cap passivating layer 16. Impurity source layer 14, may be, for example, Si or Ge heavily doped with As, P or Sb and passivating layer 16 may be comprised of $Si_3N_4$, $SiO_2$, AlN or $SiO_xN_y$. Other impurity species that also may be applicable to enhance the interdiffusion of compositional constituents, e.g., Ga and Al, would be the presence of a high number of defects (besides the presence of vacancies or even proton damage in structure 12) or various shallow or deep impurities such as, Se, Sn, O, S, Be, Te, Mn, Cd, Sn or Cr. Also, these defects could be additions from other column III-V elements, such as, B, N, Al, Ga, As, P, Sb or In. In the preferred embodiment, impurity source layer 14 is comprised of Si doped with As in the range of 5%–20% atomic percent and a thin cap layer 16 of $Si_3N_4$. Si is preferred because it will deposit in a polycrystalline state using high temperature MO-CVD processing whereas Ge will tend to deposit more crystalline at such temperatures and, therefore, a more tightly packed molecular structure, which is less desirable for an impurity source layer. $Si_3N_4$ is preferred because of its high level of impermeability to Group III-V elements, e.g., Ga and As whereas $SiO_2$, for example, permits some outdiffusion of Ga. It appears that in the absence of the As enabling agent, this outdiffusion of Ga without any outdiffusion of As from structure 12, can enable the Si diffusion process. In the case of source 10, distribution of Si and Ga occurs between impurity source layer 14 and structure 12.

Bilayer composite source 10 is deposited at high temperatures, i.e., at temperatures in excess of 500° C., in a MO-CVD reactor. Temperatures in excess of 500° C. also happen to approximate the point at which the elemental constituents of Group III-V compounds will begin to dissociate due to the high vapor pressure of the column V component. This temperature is maintained throughout the deposition of layers 14 and 16. The deposition of these layers may be in the range of 500° C.–900° C., preferably in the range of 600° C.–800° C.

Figure 2:
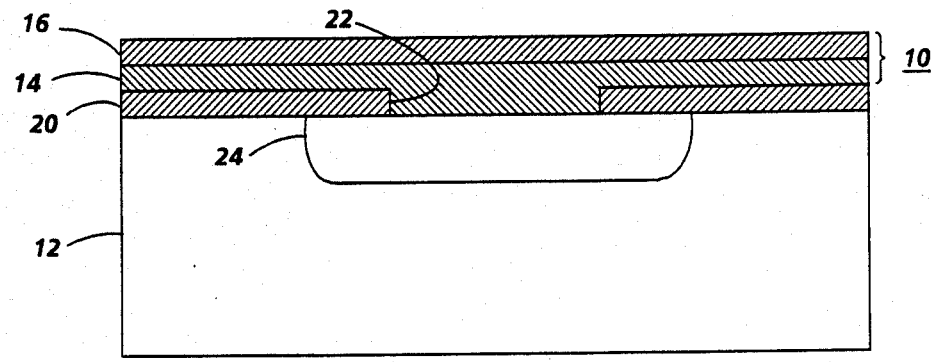
FIG. 2 is a side elevation of a thin film composite source deposited on a masking layer which is deposited on a substrate.

Bilayer diffusion source 10 disclosed in FIG. 1 may be applied in combination with masking techniques to provide for selective patterning of impurity diffusion into a semiconductor structure. Such a patterned diffusion source is illustrated in FIG. 2. Prior to the deposition of source 10, a masking layer 20 of $Si_3N_4$ is deposited on the surface of semiconductor structure 12. Layer 20 is deposited in the same manner as previously explained relative to cap layer 16. After its deposition, structure 12 is removed from the MO-CVD reactor and a selective etch is performed in layer 20, using techniques as known in the art, to produce pattern 22 by removing portions of $Si_3N_4$ film 20 to expose surface regions of structure 12. Next, source 10 is deposited in a MO-CVD reactor, in a manner as previously explained relative to FIG. 1.

Figure 3:
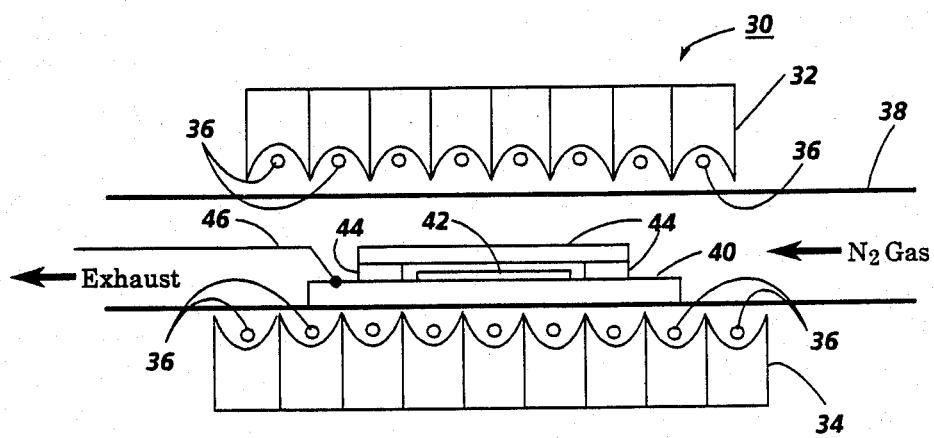
FIG. 3 is an example of an rapid thermal annealing apparatus known in the art that may be employed in the practice of this invention.

After deposition of the composite source 10, the dual step thermal annealing process of this invention is performed producing for example, a diffusion profile as illustrated at 24 in FIG. 2. The RTA treatment may be carried out in the apparatus shown in FIG. 3. Apparatus 30 is known in the art and comprises upper lamp unit 32 and lower lamp unit 34, each consisting of several halogen lamps 36, which units are positioned to face each other at alternate interleaved positional relation to improve temperature uniformity. A quartz tube 38 is positioned between lamp units 32 and 34 and a quartz or silicon plate 40 is positioned in tube 38. A sample 42, such as the structure shown in FIG. 1 or FIG. 2, is placed on plate 40 and surrounded by silicon slabs 44 to protect sample 42 from intense direct exposure of the heat from lamps 36. The temperature in tube 38 is monitored by thermocouple 46 attached to plate 40. A noble gas, such $N_2$, is supplied through tube 38 to prevent an oxidizing environment. The processing during rapid thermal annealing is carried out at a temperature of about 900° C.–1100° C. for about 10–200 seconds. After this RTA treatment, the sample is further annealed employing a STA treatment at a temperature in the range of 700° C.–900° C. for several hours, such as 4 to 10 hours. This STA treatment is the subject matter of patent application Ser. No. 07/117593 and is incorporated herein by reference thereto.

Figure 4:
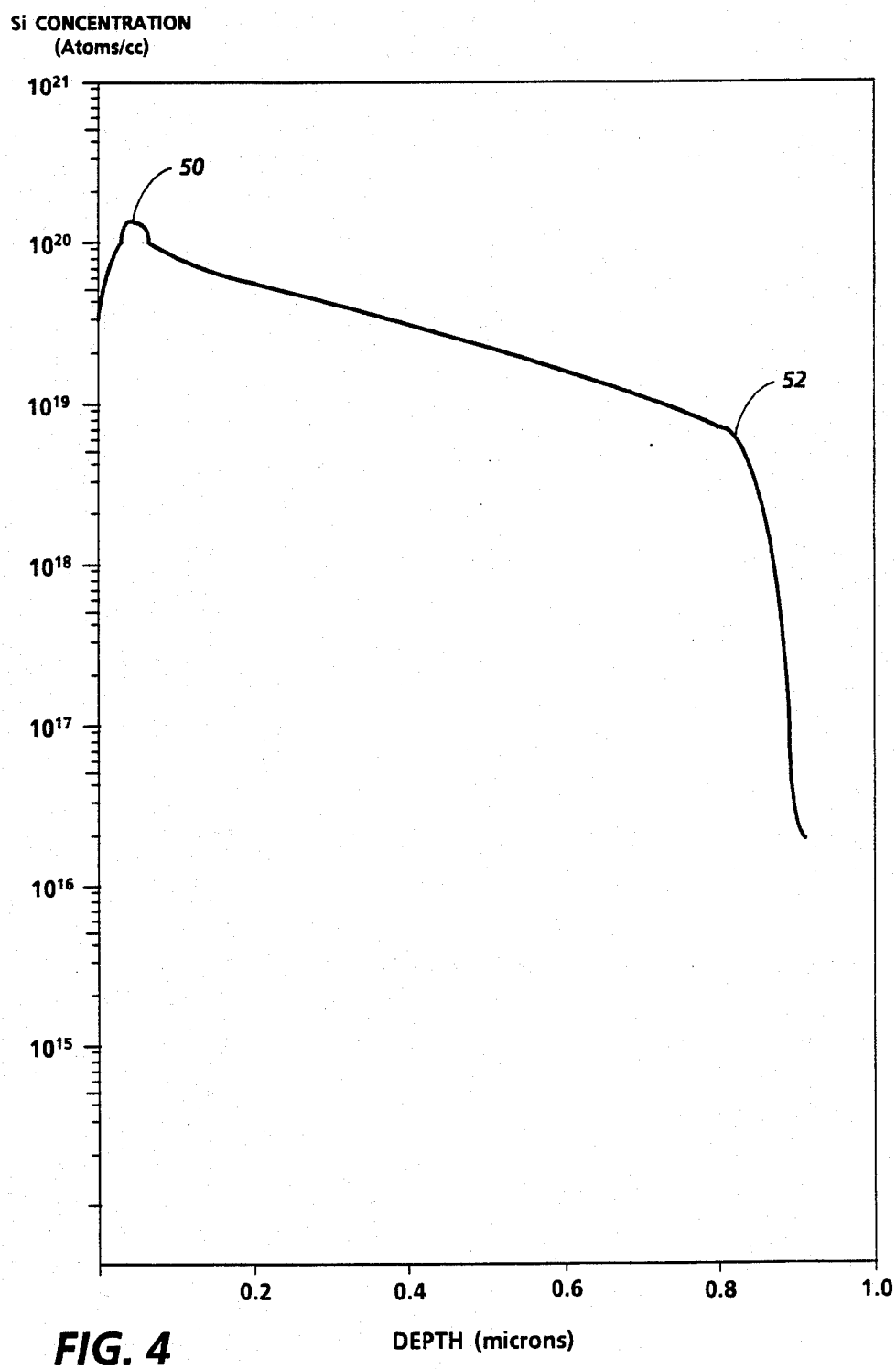
FIG. 4 is a secondary ion mass spectroscopy (SIMS) profile illustrating the extent and magnitude of a Si diffusion from a thin film deposited source into an underlying GaAs substrate employing a single anneal step comprising a high temperature, shorter term or rapid thermal annealing (RTA) treatment.
Figure 5:
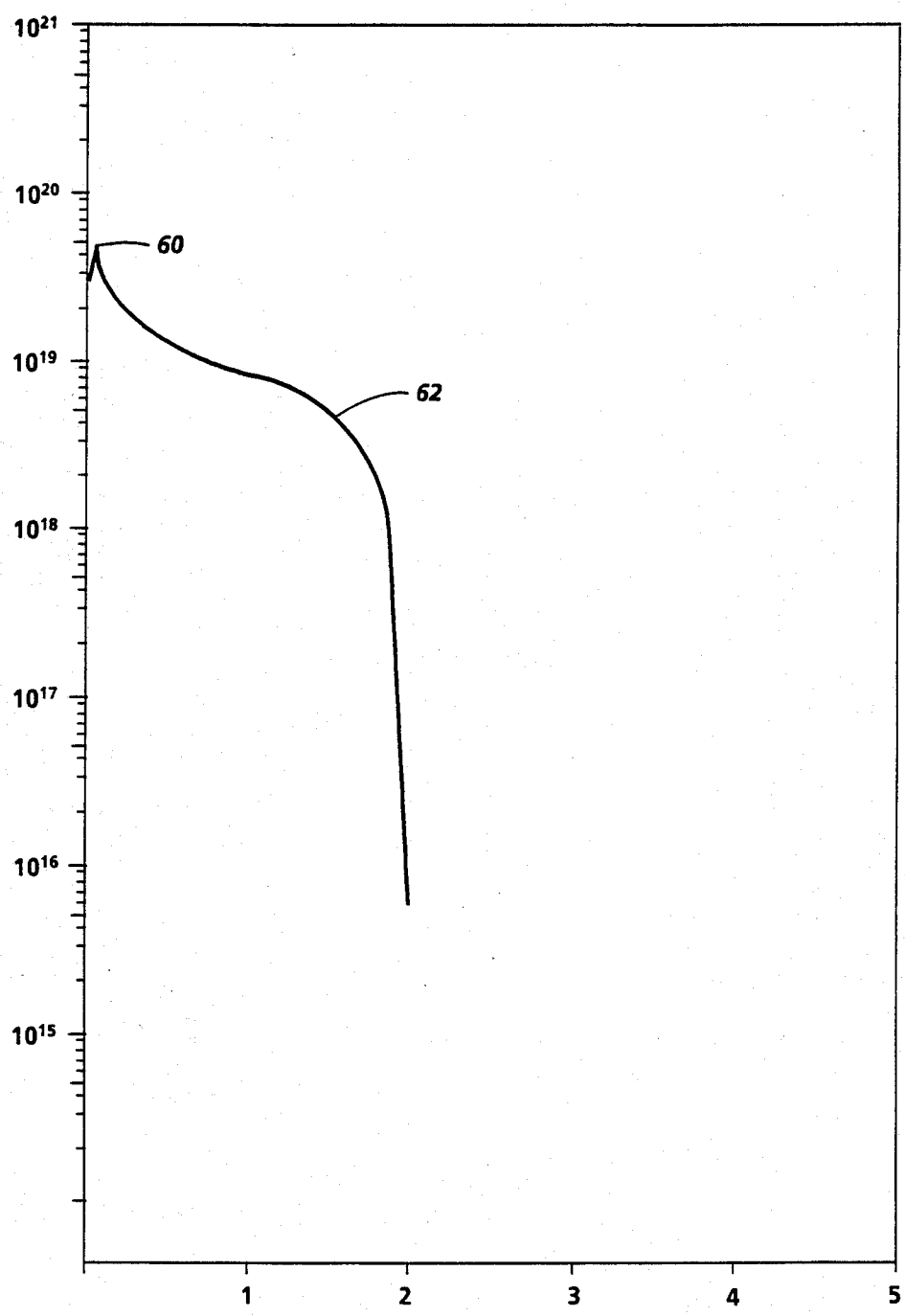
FIG. 5 is a secondary ion mass spectroscopy (SIMS) profile illustrating the extent and magnitude of a Si diffusion from a thin film deposited source into an underlying GaAs substrate employing a single annealing step comprising a low temperature, longer term or slow thermal annealing (STA) treatment.

In order to better appreciate and fully understand the dual step thermal annealing process of this invention, results for a single step high temperature, RTA anneal treatment (FIG. 4) and a single step low temperature, STA treatment FIG. 5 are to be compared with the results of the dual step thermal annealing treatment of this invention (FIG. 6) comprising a combination of these two different anneal treatment steps.

The particular samples for structure 12 employed in all cases of thermal anneal treatment to be discussed comprised a GaAs substrate positioned on the susceptor of a MO-CVD reactor. The run temperature of the reactor was set at about 680° C., which is the approximate temperature existing at the reactor susceptor where chemical deposition will take place. The first layer deposited in the reactor was polycrystalline Si in the presence of a heavy concentration of As. $SiH_4$ was fed into the reactor at 20 sccm with 10% $AsH_3$ at 500 sccm via a carrier gas of $H_2$ at 30 sccm. 10% $AsH_3$ means that the $AsH_3$ gas is 10% diluted in $H_2$ gas. The flow of these gases ($SiH_4 + AsH_3 \rightarrow Si(As)$) was maintained for about 4 minutes to produce a deposited layer 14 on structure 12 which was about a 400 Å thick poly Si film doped with As at about 10 atomic percent.

Next, the source of 10% $AsH_3$ was reduced to a flow of 200 sccm and the flow of $NH_3$ gas was initiated commenced and fed into the reactor at a flow rate of 90 sccm with the $SiH_4$ flow still maintained at 20 sccm in the same carrier gas concentration flow of $H_2$ at 30 sccm. The continued flow of $AsH_3$ is not as critical and, therefore, may be discontinued. However, it is believed that its presence may help to prevent any As outdiffusion from substrate 12 and deposited layer 14.

The flow of gases was maintained for approximately 18 minutes to produce a deposited layer 16 comprising an approximately 400 Å thick film of $Si_3N_4$ ($SiH_4 + NH_3 \rightarrow Si_3N_4$). Layer 16 should remain relatively thin, e.g, within the range of 400 Å–700 Å. It is preferred that layer 16 be sufficiently thick to prevent any substantial outdiffusion of Ga or As from structure 12 or layer 14. The thickness of impurity source layer 14 is not critical. The range of thickness for layer 14 in my work has been about 200 Å–400 Å. Layer 14, however, should be sufficiently thick to provide sufficient Si source to ensure good diffusion penetration of Si during the subsequent high temperature anneal treatment. On the other hand, layer 14 should not be so thick as to introduce thermal strain effects that may cause anomalous diffusion profiles. While such anomalous diffusion profiles have been found not to occur with the deposit of an impurity source prior to STA treatment with both accomplished in the same range of temperatures, a deposited diffusion source layer to thick could introduce such strain effects.

After removing a sample from the MO-CVD reactor, one such sample was subjected exclusively to a high temperature, RTA treatment. The sample was placed in apparatus 30 for about 100 seconds at a temperature of about 1000° C. and then removed for a SIMS profile analysis.

In FIG. 4, the resulting SIMS profile for this sample 12 shows that at the surface of the GaAs sample, there is a high level concentration of Si at 50, which concentration is above $10^{20}$. Also, the profile gradually decreases from a Si concentration of $10^{20}$ to $10^{19}$ just above an abrupt rolloff at knee 52, which is a diffusion depth into sample 12 of approximately 0.8 μm.

FIG. 5 shows a SIMS profile for another such sample 12, with a Si source film deposited in a manner as the previously mentioned sample but was subjected exclusively to a lower temperature, STA treatment as taught in patent application, Ser. No. 07/117593. The sample 12 was placed in a quartz tube inside a standard heating oven. Thermal annealing of sample 12 was accomplished for 10 hours at a temperature of 850° C. As shown in the FIG. 5 SIMS results for this sample, there is a high level of concentration of Si at the surface of the sample, as indicated at 60. However, this sample has a lower concentration level in FIG. 5 compared to that obtained in the RTA treatment of FIG. 4, i.e., below $5 \times 10^{19}$ in FIG. 5 compared to above $10^{20}$ in FIG. 4. Thus, higher surface impurity concentration in sample 12 is achieved by exclusively employing a single RTA treatment. However, in employing the STA treatment, the depth of Si diffusion is greater, showing a heavy impurity species concentration of $10^{19}$ just above an abrupt rolloff at knee 62 with a resulting diffusion depth of approximately 1.4 μm in GaAs substrate. STA treatment may be carried out in a wide temperature range, determined mainly by the depth of the diffusion desired. As an example, to reach a depth of about 2 μm in several hours, a temperature of 850° C. is appropriate. Also, the diffusion depth of the impurity species into sample proceeds approximately as the square root of the annealing time.

As is evident from FIG. 5, there is high concentration of Si of about $2 \times 10^{19}$ at the surface of GaAs substrate sample 12, as previously indicated at point 60, with a gradual drop in concentration to $3 \times 10^{18}$ to knee 62, after which there is a rolloff of Si concentration at about the depth of 2 μm into GaAs substrate 12. It should be noted that this contrasts very significantly with T. Onuma et al, supra, and M. E. Greiner et al, supra, which indicate negligible diffusion occurring when employing a $Si_3N_4$ encapsulation, respectively, on a GaAs substrate and on a Si layer deposited on a GaAs substrate. The reason for the apparent discrepency is the absence of the As doping in the films deposited by Greiner et al, this As doping being an enabling agent for the diffusion process.

Figure 6:
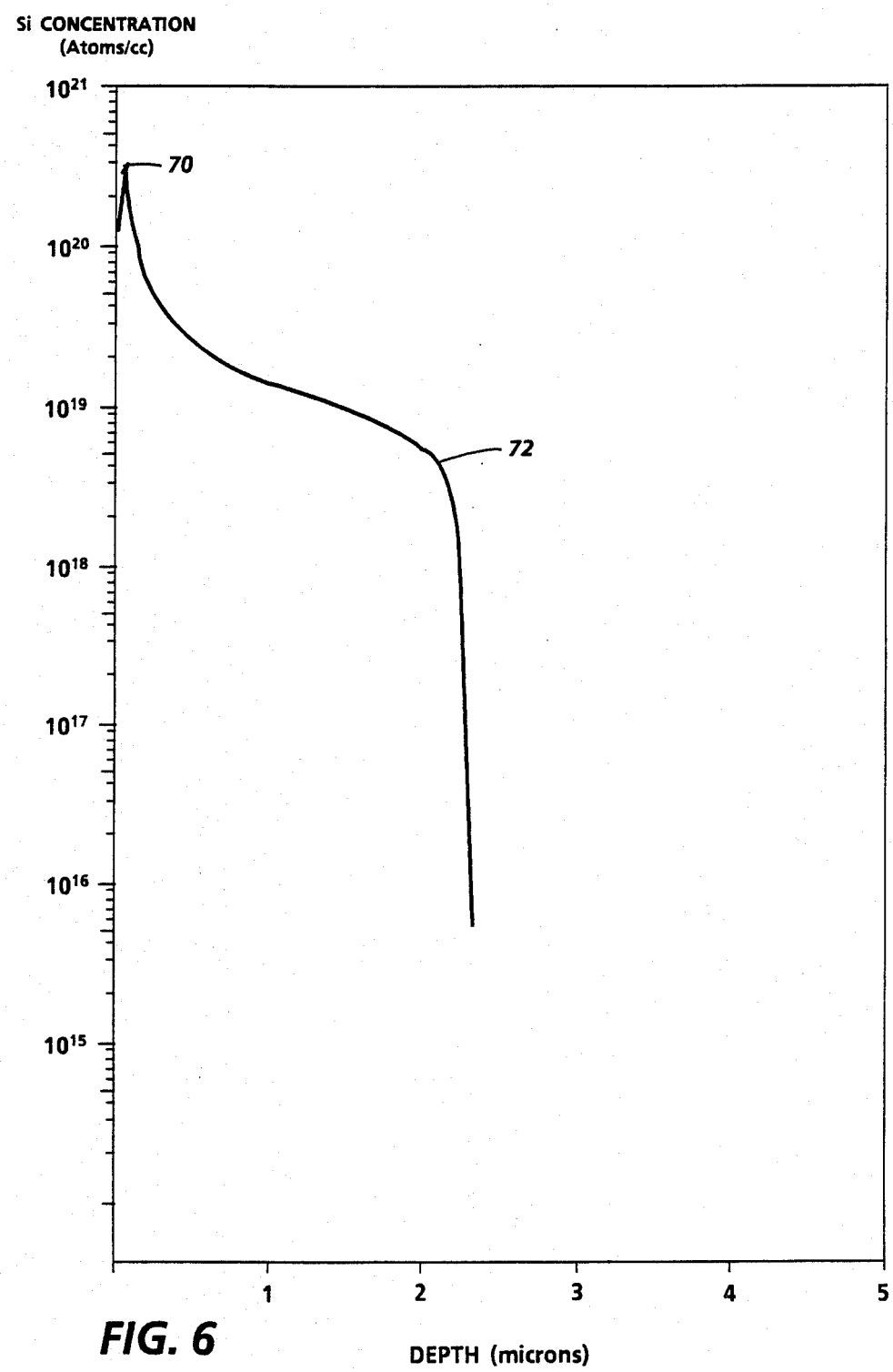
FIG. 6 is a secondary ion mass spectroscopy (SIMS) profile illustrating the extent and magnitude of a Si diffusion from a thin film deposited source into an underlying GaAs substrate employing a dual annealing step of this invention comprising a high temperature, shorter term or rapid thermal annealing (RTA) treatment followed by a low temperature, longer term or slow thermal annealing (STA) treatment.

FIG. 6 shows a SIMS profile for another sample, fabricated nominally as previously discussed, which was thermally annealed employing an initial high temperature, RTA treatment using apparatus 30 followed by a low temperature, STA treatment. To be noted from FIG. 6 is the higher Si concentration at the surface of the sample, as indicated at 70, being approximately $3 \times 10^{20}$ Si concentration and compasrable with the RTA treatment per se. Further, the Si diffusion profile has proceeded into the sample to a diffusion depth of about 2 μm just above knee 72, exceeding depth penetration available from the STA treatment per se. It follows from this observation that for a given total diffusion period for a given desired diffusion temperature, an extended depth penetration of the diffusion profile can be realized due to an initially high impurity species or diffusant concentration established at the surface regions of the III-V sample undergoing IID treatment. This higher impurity concentration is brought about by initially employing the high temperature, RTA treatment.

Thus, the larger the impurity species concentration provided at the sample surface with a concentration above impurity species threshold or transition level, the deeper the diffusion profile penetration into the crystal bulk. This deeper diffusion profile penetration over that possible in patent application Ser. No. 07/117,593 is accomplished at comparatively the same STA temperature with the same period of anneal as taught in that application but is deeper due to the RTA initialization of heavy impurity concentration at the sample surface. At sufficiently high impurity species concentrations, substantially enhanced interdiffusion is observed when diffusion is performed into a multilayer structure where the layers have varying alloy composition of $Ga_{1-x}Al_xAs$. Experiments have shown that a relatively high concentration of impurity species is required to bring about this interdiffusion enhancement. This higher concentration for Si is approximately around $1.5 \times 10^{18}/cm^3$ to $3 \times 10^{18}/cm^3$ for Si doping and approximately around $1-3 \times 10^{19}/cm^3$ for Zn doping. Thus, there is a remarkably increased mobility of the interdiffusion of Ga and Al atoms during IID treatment when the Si or Zn concentration at the sample surface is at least within the above mentioned ranges. With the selective patterning of prescribed regions of the sample by the masking process previously described, selected regions of a sample may be subjected to this enhanced interdiffusion providing for sharp delineation of ordered/disordered regions for fabricateing two dimensional semiconductor devices.

While the invention has been described in conjunction with specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A method of converting at least a portion of a Group III-V semiconductor structure into a region having different bandgap properties than originally deposited layers in the region so converted from comprising the steps of epitaxially depositing a first Group III-V semiconductor region interposed between second Group III-V semiconductor regions of higher bandgap than said first region, depositing a impurity diffusion source layer on at least a portion of the surface of said Group III-V semiconductor structure in the presence of a diffusion enabling agent, depositing a thin passivating layer on said diffusion source layer of a thickness to prevent the outdiffusion of Group III-V elemental constituents therethrough, and initially annealing said structure at a high temperature for a short period of time to induce a heavy concentration of said impurity species in the immediate surface region of said structure, and thereafter annealing said structure at a low temperature for a long period of time to bring about a sharp diffusion profile extending into said structure converting said first and second semiconductor regions into a region of disordered alloy comprising materials of both of said first and second semiconductor regions, said alloy region exhibiting a higher energy gap than said first semiconductor region.

2. A method of introducing impurity species into a Group III-V semiconductor structure comprising the steps of depositing a diffusion source layer comprising the impurity species of Si or Ge on the surface of said structure in the presence of an source of As, P or Sb heavily doping said layer in the range of 5 to 20 by atomic percent, depositing a thin cap layer on said diffusion source layer to prevent the outdiffusion of elemental constituents comprising said structure, initially annealing said structure at a high temperature in the range of 900° C. to 1100° C. to overcome any interfacial barrier to diffusion of said impurity species into said structure and to form in a surface region of said structure a surface diffusion profile containing a high concentration of said impurity species, thereafter annealing said structure at a lower temperature in the range of 700° C. to 900° C. to induce an extension of the diffusion profile deeper into said structure, the combination of said annealing steps creating a diffusion profile having a sharp delineation in said structure and permitting a deeper penetration of the diffusion profile compared to the penetration depth obtainable employing exclusively the second of said annealing steps at a given temperature due to the presence of said surface diffusion profile.

3. The method of introducing impurity species into a semiconductor structure of claim 2 wherein said layers are deposited at a temperature in the range of 500° C. to 900° C., preferably in the range of 700° C. to 850° C.

4. The method of introducing impurity species into a semiconductor structure of claim 2 wherein said initial annealing step is carried out in the range of 10 to 200 seconds and said thereafter annealing step is carried out for several hours.

5. The method of claim 1 wherein said initial annealing step is carried out at a high temperature in the range of 900° C. to 1100° C. and said thereafter annealing step is carried out at a lower temperature in the range of 700° C. to 900° C.

6. The method of claim 5 wherein said layers are deposited at a temperature in the range of 500° C. to 900° C., preferably in the range of 700° C. to 850° C.

7. The method of claim 5 wherein said initial annealing step is carried out in the range of 10 seconds to several tens of seconds and said thereafter annealing step is carried out for several hours.

* * * * *